(12) United States Patent
Yagishita (10) Patent No.: US 6,552,957 B2
(45) Date of Patent: Apr. 22, 2003

(54) SEMICONDUCTOR INTEGRATED CIRCUIT HAVING A SIGNAL RECEIVING CIRCUIT

(75) Inventor: Yoshimasa Yagishita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/050,952

(22) Filed: Jan. 22, 2002

(65) Prior Publication Data

US 2002/0145935 A1 Oct. 10, 2002

(30) Foreign Application Priority Data

Apr. 10, 2001 (JP) ........................................ 2001-110851

(51) Int. Cl.[7] .............................. G11C 8/00; G06F 1/04
(52) U.S. Cl. .................. 365/233; 365/194; 365/230.08; 327/298
(58) Field of Search ............................ 365/194, 230.08, 365/189.05, 233; 327/295, 296, 298, 299

(56) References Cited

U.S. PATENT DOCUMENTS

| 6,111,815 A | * | 8/2000 | Takeda | ...................... 365/236 |
| 6,351,432 B1 | | 2/2002 | Higashiho et al. | ...... 365/189.05 |
| 6,356,508 B1 | * | 3/2002 | Yoshimoto | ............. 365/189.05 |
| 6,445,642 B2 | * | 9/2002 | Murakami | ................... 365/233 |

* cited by examiner

Primary Examiner—Son Mai
(74) Attorney, Agent, or Firm—Arent Fox Kintner Plotkin & Kahn, PLLC (57) ABSTRACT

A timing signal generator receives a plurality of control signals in synchronization with a clock signal, and generates a timing signal according to a combination of the control signals. A delay circuit delays an input signal received asynchronously to the clock signal by a predetermined time. A receiving circuit receives the input signal which is delayed by the delay circuit, in synchronization not with the clock signal but with the timing signal. Namely, the receiving circuit operates asynchronously to the clock signal, and receives only necessary input signals for the semiconductor integrated circuit. This lowers operation frequency of the receiving circuit, thereby reducing power consumption. The number of the circuits to be operated in synchronization with the clock signal can be reduced, by which reduces standby current. An increase in the standby current is gradual even when frequency of the clock signal goes high.

5 Claims, 9 Drawing Sheets

SEMICONDUCTOR INTEGRATED CIRCUIT HAVING A SIGNAL RECEIVING CIRCUIT

BACKGROUND OF THE INVENTION

1. Field of the Invention

The present invention relates to a semiconductor integrated circuit which operates in synchronization with a clock signal and, more particularly, to a semiconductor integrated circuit having a receiving circuit of an input signal. Further, the present invention relates to a semiconductor integrated circuit having a memory array.

2. Description of the Related Art

The amount of data used in portable equipment such as a cellular phone has been yearly increasing. Accordingly, there has been needed a semiconductor memory with large capacity and high speed to be mounted on the portable equipment. A DRAM of a clock synchronous type such as SDRAM (Synchronous DRAM) is a promising semiconductor memory to be mounted on portable equipment of this kind because of its large capacity and high speed.

Meanwhile, the portable equipment operates with a battery. Hence, electronic parts mounted on the portable electronic equipment are required to have low power consumption. Particularly, since the cellular phone is often used outdoors for a long period of time, low power consumption during standby is of significance.

It is considered that, a standby current of the SDRAM is mainly charge and discharge current which occurs along with oscillation of a clock signal generated in circuits for receiving a clock signal. Hence, the standby current of the SDRAM increases in proportion to the frequency of the clock signal to be supplied. Therefore, there has been a tendency to avoid mounting the semiconductor integrated circuit of the clock synchronous type such as the SDRAM on the portable equipment with high operation frequency despite of its large capacity and high speed.

SUMMARY OF THE INVENTION

It is an object of the present invention to reduce a standby current of a semiconductor integrated circuit of a clock synchronous type.

Particularly, it is an object of the present invention to provide a circuit technique for minimizing increase in the standby current when the frequency of a clock signal increases.

According to one of the aspects of the semiconductor integrated circuit of the present invention, a timing signal generator receives a plurality of control signals in synchronization with a clock signal and generates a timing signal according to a combination of the control signals. A delay circuit delays an input signal received asynchronously to the clock signal by a predetermined time. A receiving circuit receives the input signal delayed by the delay circuit, in synchronization not with the clock signal but with the timing signal. Namely, the receiving circuit operates asynchronously to the clock signal, and receives only necessary input signals for the internal operation of the semiconductor integrated circuit.

When a combination of the control signals is not the one for generating the timing signal, the timing signal is not generated, and hence the receiving circuit does not operate. Operation frequency of the receiving circuit decreases, thereby reducing power consumption of the receiving circuit. A decrease in the number of the circuits operating in synchronization with the clock signal enables a reduction in current consumption (standby current) particularly during a standby mode in which an internal circuit is not operated. Since the number of the circuits operating in synchronization with the clock signal is small, an increase in the standby current is gradual even when the frequency of the clock signal increases.

According to another aspect of the semiconductor integrated circuit of the present invention, an input buffer receives the input signal asynchronously to the clock signal and outputs the received signal to the delay circuit. Hence, the input signal is transmitted to the receiving circuit asynchronously to the clock signal. Since the number of the circuits operating in synchronization with the clock signal can be reduced, it is possible to reduce the standby current.

According to another aspect of the semiconductor integrated circuit of the present invention, the receiving circuit receives an address signal. The address signal is normally composed of a plurality of bits in order to identify one of a plurality of areas in the semiconductor integrated circuit. It is necessary to provide the receiving circuit for each bit of the address signal. Therefore, the receiving circuit receiving the address signal realizes a substantial reduction in the standby current.

According to another aspect of the semiconductor integrated circuit of the present invention, the receiving circuit receives a data signal. The data signal is normally composed of a plurality of bits in order to increase a data transfer rate. The receiving circuit is required to be provided for each bit of the data signal. Therefore, the receiving circuit receiving the data signal realizes a substantial reduction in the standby current.

According to another aspect of the semiconductor integrated circuit of the present invention, the timing signal generator receives a plurality of command signals in synchronization with the clock signal and generates the timing signal for instructing operation of a memory array according to the combination of the command signals. The receiving circuit receives the address signal for identifying a memory cell in the memory array, in synchronization with the timing signal. Further, a predetermined memory cell corresponding to the address signal is selected from a plurality of the memory cells in the memory array, and read operation or the like is performed.

The address signal is generally composed of a large number of bits in order to select any of the plurality of memory cells in the memory array. The receiving circuit is required to be provided for each bit of the address signal. Therefore, the standby current can be substantially reduced by applying the present invention to the semiconductor integrated circuit having the memory array.

According to another aspect of the semiconductor integrated circuit of the present invention, a delay time of the delay circuit is set corresponding to a time from reception of the command signal to output of the timing signal by the timing signal generator. In the semiconductor integrated circuit of the clock synchronous type (semiconductor memory), the command signal and the address signal are generally supplied from the exterior of the integrated circuit, in synchronization with the same edge of the clock signal. Namely, the command signal and the address signal are supplied so as to satisfy set-up time and hold time with respect to the edge of the clock signal. Hence, setting the delay time according to the time taken for generating the timing signal from the command signal enables concurrent arrival of the timing signal and the address signal in the receiving circuit. This makes it possible to reliably receive the address signal supplied with the command signal in the receiving circuit, in synchronization with the clock signal.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENT

Hereinafter, a preferred embodiment of the present invention will be explained with reference to the drawings.

Figure 1:
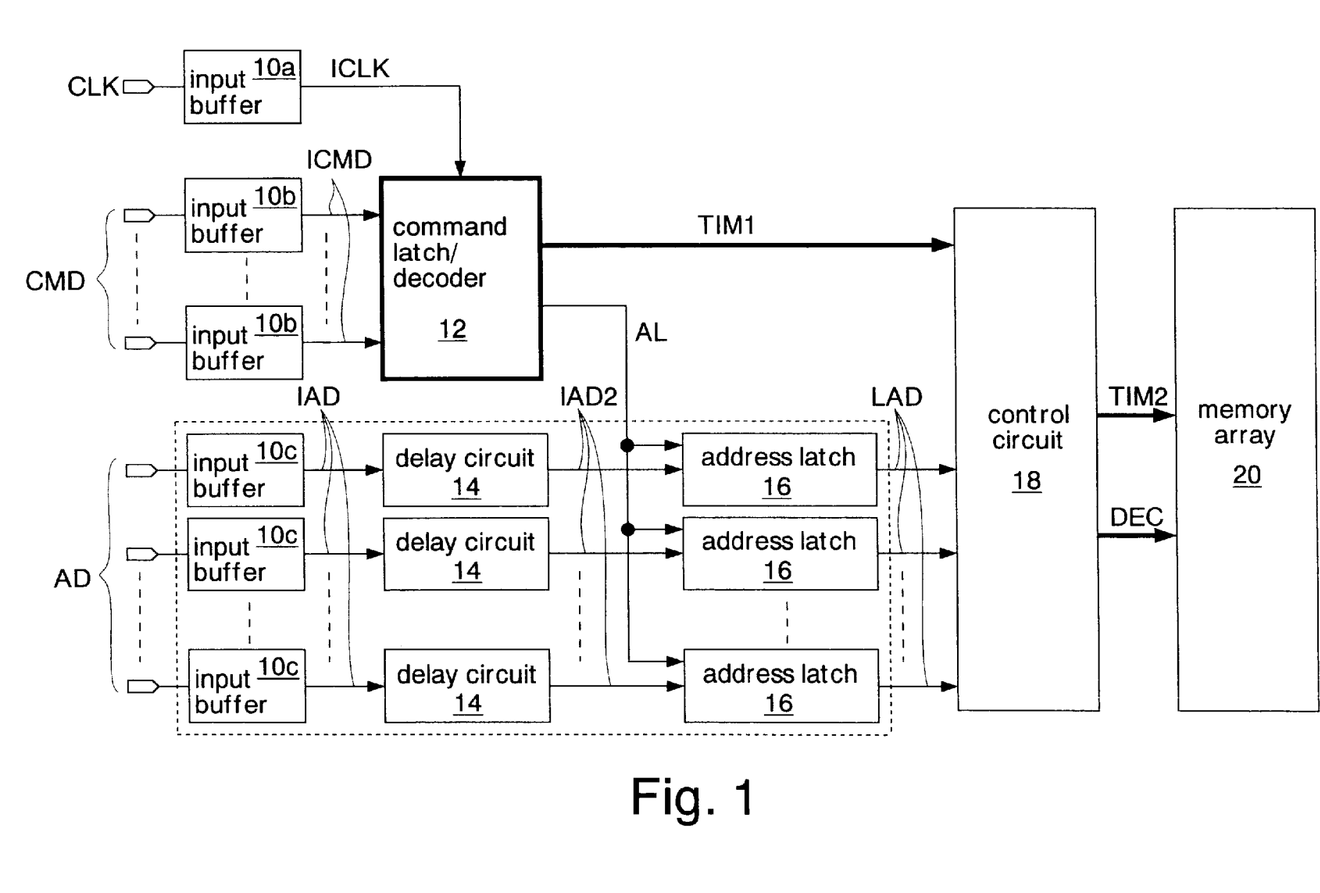
FIG. 1 is a block diagram showing an embodiment of the present invention.

FIG. 1 shows an embodiment of the semiconductor integrated circuit according to the present invention. This semiconductor integrated circuit is formed on a silicon substrate as SDRAM of a clock synchronous type, by using a CMOS process.

The SDRAM includes a plurality of input buffers 10a, 10b, and 10c, a command latch/decoder 12, delay circuits 14, address latches 16, a control circuit 18, and a memory array 20. The command latch/decoder 12 indicated by a bold frame is the circuit which operates in synchronization with a clock signal CLK. Each of the signal lines indicated by bold lines is composed of a plurality of signals. It should be noted that circuits concerning input/output of data are not shown in this embodiment.

The input buffer 10a receives the clock signal CLK from the exterior of the memory and outputs the received signal as an internal clock signal ICLK. Each of the input buffers 10b receives a command signal CMD from the exterior and outputs the received signal as an internal command signal ICMD. Each of the input buffers 10c receives an address signal AD (input signal) from the exterior and outputs the received signal as an internal address signal IAD. All of the input buffers 10a, 10b and 10c operate asynchronously to the clock signal CLK (ICLK).

The command latch/decoder 12 receives the internal command signals ICMD in synchronization with the internal clock signal ICLK and decodes the received signals. The command signals CMD and the internal command signals ICMD are control signals for operating an internal circuit of the SDRAM. According to the decoding results, the command latch/decoder 12 outputs a plurality of timing signals TIM1 and address latch signals AL (timing signals). In other words, the command latch/decoder 12 operates as a timing signal generator which generates the timing signals TIM1 and the address latch signals AL according to combinations of the command signals CMD.

When, for example, the command signals CMD are read commands for instructing read operation, the command latch/decoder 12 outputs the timing signals TIM1 for activating the memory array 20 to the control circuit 18, and outputs the address latch signals AL for receiving the address signals AD to the address latches 16. The address latch signals AL are timing signals which are outputted in synchronization with the internal clock signal ICLK in order to operate the address latches 16.

The delay circuits 14 delay the internal address signals IAD transmitted from the buffers 10c by a predetermined time, and output the delayed signals as internal address signals IAD2. As will be described later, the delay time of each delay circuit 14 is set so that a time from the input of the address signal AD to the output of the internal address signal IAD2 equals a time from a rising edge of the clock signal CLK to a rising edge of the address latch signal AL. Namely, the delay time is set according to operation timing of the command latch/decoder 12.

The address latches 16 receive the internal address signals IAD2 in synchronization with the address latch signals AL, and output the received signals as latched address signals LAD. Namely, each address latch 16 operates as a receiving circuit of the address signal AD. Thus, the address signals AD supplied from the exterior are transmitted to the address latches 16 asynchronously to the clock signal CLK. Incidentally, a circuit for directly receiving the address signals AD, the internal address signals IAD and IAD2 by the clock signal CLK does not exist in this embodiment.

The control circuit 18 generates a plurality of timing signals TIM2, address decoding signals DEC and the like for operating the memory array 20, according to the timing signals TIM1 and the latched address signals LAD. The memory array 20 includes a plurality of memory cells, decoders, sense amplifiers and the like which are not shown in the drawing. The memory array 20 is activated in synchronization with the timing signals TIM2 to perform the read operation, write operation, refresh operation or precharge operation of a bit line. The memory cells to which data is written, the sense amplifier to operate, and the like are selected according to the address decoding signals DEC.

Figure 2:
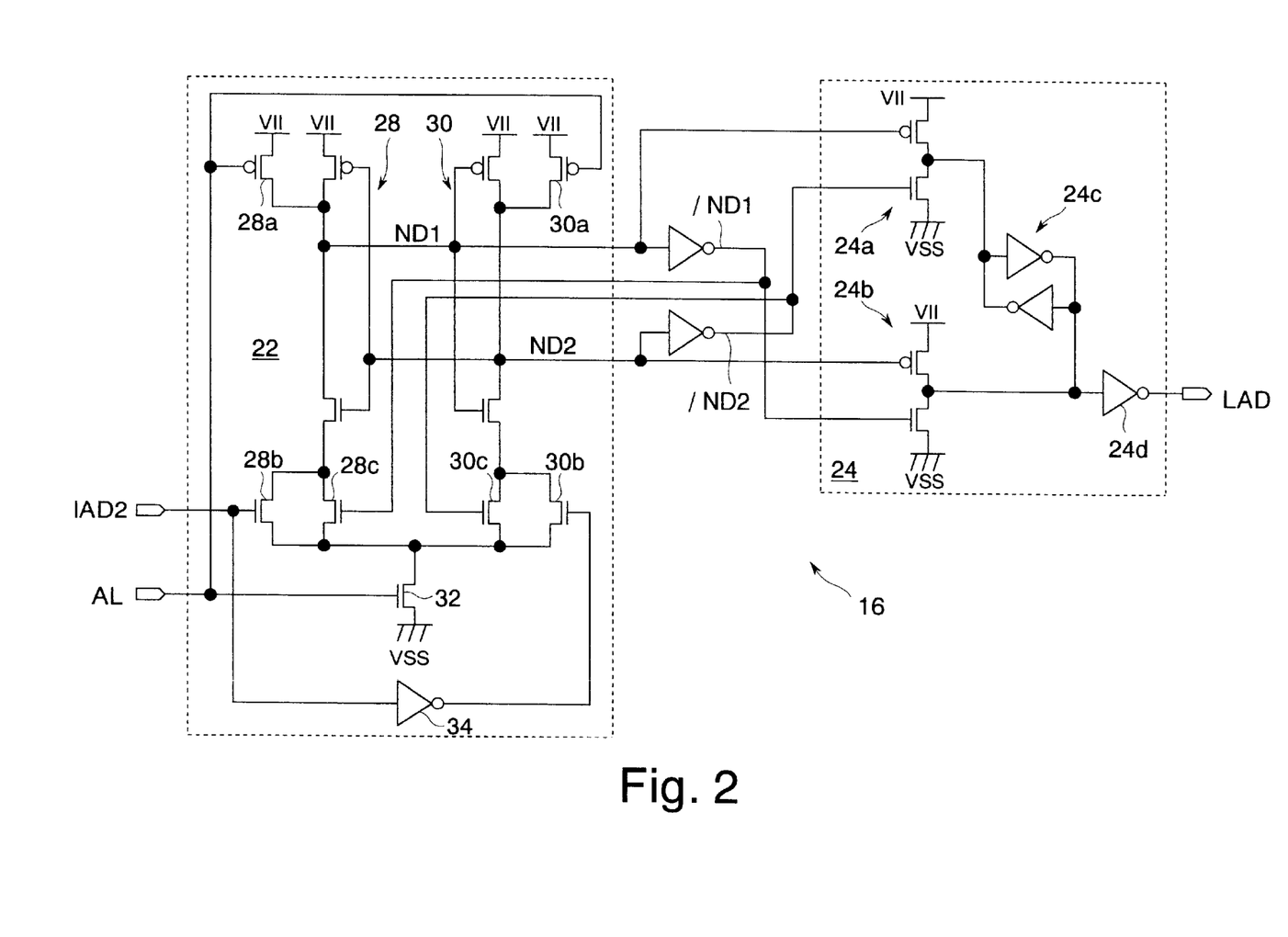
FIG. 2 is a circuit diagram showing the details of an address latch in FIG. 1.

FIG. 2 shows the details of the address latch 16. The address latch 16 includes a signal latching part 22 and a signal outputting part 24.

The signal latching part 22 is composed of CMOS inverters 28, 30 whose inputs and outputs are connected to each other, pMOS transistors 28a, 30a (hereinafter simply referred to as the pMOSs) which connect output nodes ND1, ND2 of the CMOS inverters 28, 30 respectively to a power source line VII, nMOS transistors 28b, 28c, 30b, 30c, and 32 (hereinafter simply referred to as the nMOSs) which connect sources of nMOS transistors of the CMOS inverters 28, 30 to a ground line VSS, and an inverter 34.

The address latch signal AL is supplied to gates of the pMOSs 28a, 30a and a gate of the nMOS 32. The internal address signal IAD2 is supplied to a gate of the nMOS 28b, and an inverting signal of the internal address signal IAD2 is supplied to a gate of the nMOS 30b through the inverter 34. Inverting nodes /ND1, /ND2 of the nodes ND1, ND2 are connected to gates of the nMOSs 28c, 30c, respectively.

The signal outputting part 24 includes two output circuits 24a, 24b each of which is composed of a pMOS and an nMOS, a latch 24c, and an inverter 24d. The latch 24c is composed of two inverters whose inputs and outputs are connected to each other, and the inputs of the inverters respectively receive outputs of the output circuits 24a, 24b. The inverter 24d inverts an output level of the output circuit 24b, and outputs the inverted signal as the latched address signal LAD.

In the above-described address latch 16, the pMOSs 28a, 30a of the signal latching part 22 turn on and the nodes ND1, ND2 turn into high levels, when the address latch signal AL is at a low level. When the nodes ND1, ND2 are at the high levels, both of the output circuits 24a, 24b of the signal outputting part 24 turn off. Hence, the signal outputting part 24 outputs the address signal which is held in the latch 24c as the latched address signal LAD.

When the address latch signal AL turns into a high level, the nMOS 32 of the signal latching part 22 turns on, and the CMOS inverters 28, 30 are activated. Either nMOS 28b or nMOS 30b turns on according to a level of the internal address signal IAD2, and the levels of the nodes ND1, ND2 are changed to be opposite to each other. The levels of the nodes ND1, ND2 are fed back to the nMOSs 28c, 30c, and the state of the signal latching part 22 is fixed. Once the levels of the nodes ND1, ND2 are determined, the state of the signal latching part 22 will not change thereafter, even if the internal address signal IAD2 changes. Namely, the address signal AD is latched in synchronization with the rising edge of the address latch signal AL.

When the address latch signal AL turns into the low level again, the pMOSs 28a, 30a turn on and the nodes ND1, ND2 turn into the high levels. Therefore, the address latch 16 consumes current when the level of the address latch signal AL changes. The address latch 16 is composed of a CMOS circuit so that it hardly consumes current when the level of the address latch signal AL is not changed.

Figure 3:
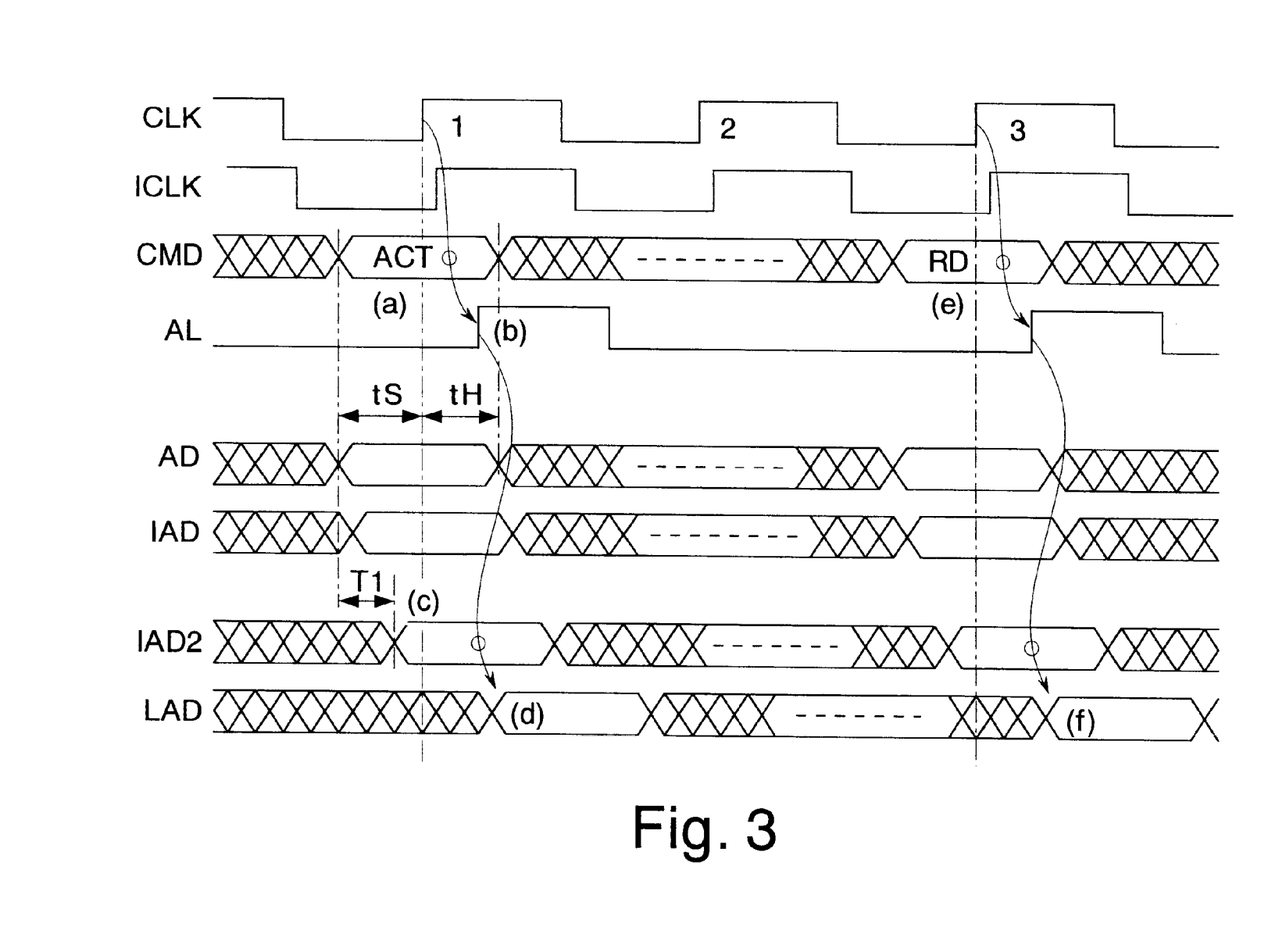
FIG. 3 is a timing chart showing receiving operation of an address signal.

FIG. 3 shows receiving operation of the address signal AD in the above-described SDRAM. In this example, an active command ACT and a read command RD are successively supplied to the SDRAM in order to perform the read operation. The command signal CMD and the address signal AD are supplied while satisfying a predetermined set-up time tS and hold time tH with respect to the rising edge of the clock signal CLK.

First, the command signal CMD (ACT) and the address signal AD (column address signal) are supplied (FIG. 3(a)). The command latch/decoder 12 shown in FIG. 1 latches the command signal CMD in synchronization with a rising edge of the internal clock signal ICLK and decodes the latched signal. Then, the command latch/decoder 12 identifies that the command signal CMD is the active command ACT, and activates the address latch signal AL (FIG. 3(b)).

Each delay circuit 14 shown in FIG. 1 delays the internal address signal IAD from each input buffer 10c, and outputs it as the internal address signal IAD2 (FIG. 3(c)). It should be mentioned that a time T1 from a change in the address signal AD to a change in the internal address signal IAD2 is equal to a time from the rising edge of the clock signal CLK to the activation of the address latch signal AL. That is, the internal address signal IAD2 is supplied earlier to the address latches 16 by at least the set-up time tS than the rising edge of the address latch signal AL. Each address latch 16 latches the internal address signal IAD2 in synchronization with the rising edge of the address latch signal AL, and outputs it as the latched address signal LAD (FIG. 3(d)). Thereafter, a word line and the sense amplifier are activated according to the latched address signal LAD (row address signal) and the memory array 20 is operated.

Next, the command signal CMD (RD) and the address signal AD (column address signal) are supplied in synchronization with the rising edge of the third clock signal CLK (FIG. 3(e)). Each address latch 16 latches the internal address signal IAD2 in synchronization with the address latch signal AL, similarly to the above, and outputs the latched signal as the latched address signal LAD (FIG. 3(f)). Thereafter, a column switch in the memory array 20 is selected according to the latched address signal LAD (column address signal) and the read data is outputted.

Thus, the address latches 16 receive the address signals AD (IAD2) in synchronization not with the clock signal CLK (ICLK) but with the address latch signals AL. Low operation frequencies of the address latches 16 enables reduction in power consumption. Since the number of the address latches 16 is large (ten bits, for example), it is possible to attain large effects of the reduction in the power consumption.

Figure 4:
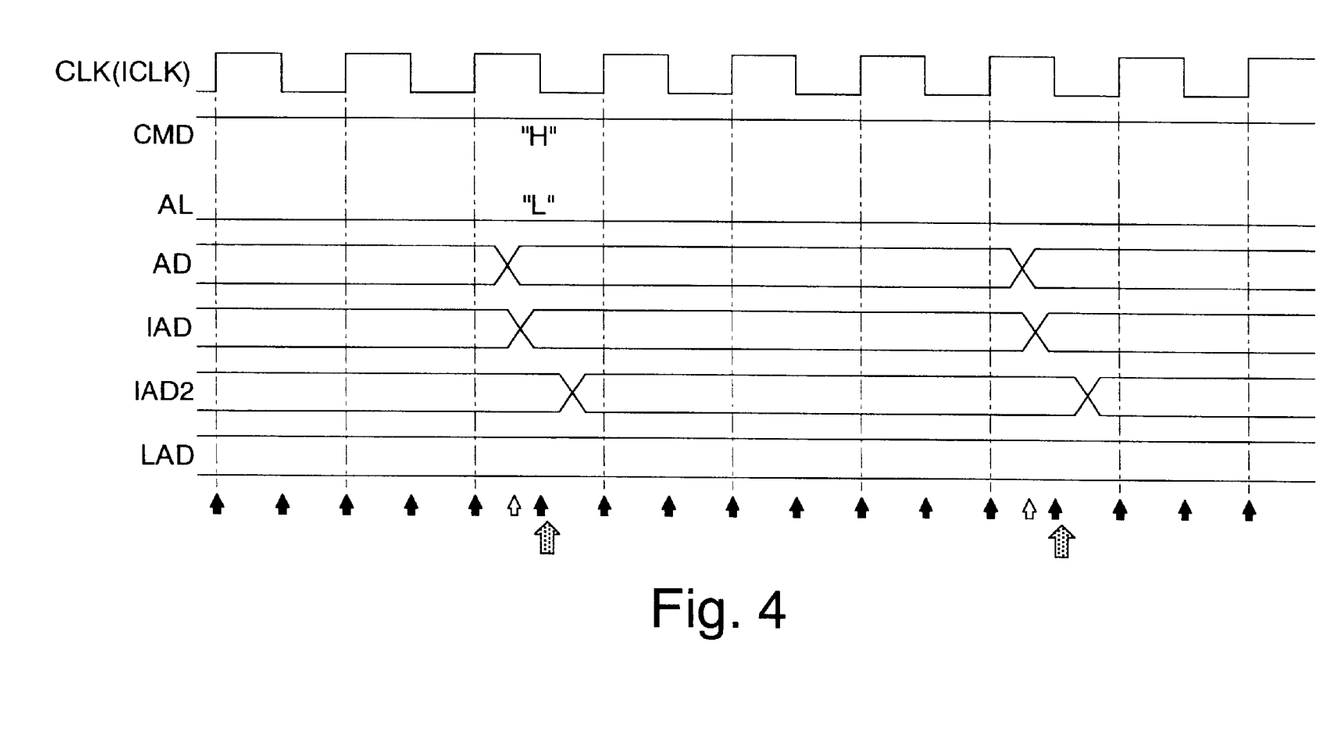
FIG. 4 is a timing chart showing the receiving operation of the address signal in a standby state (when the frequency of a clock signal is low)

FIG. 4 shows the receiving operation of the address signal AD in a standby state in the above-described SDRAM (when the frequency of the clock signal CLK is low). During the standby state, the SDRAM keeps on receiving the clock signal CLK, but does not perform its internal operation. Arrows on the lower side of the drawing indicate timings at which the current is consumed. The size of the arrows represents the magnitude of the current. When a controller such as CPU mounted on the system with the SDRAM, accesses other devices on the system, the address signal AD changes.

Black arrows represent the current when the input buffer 10a and the command latch/decoder 12 operate according to the change in the clock signal CLK. White arrows represent the current when the input buffers 10c operate according to the change in the address signals AD. Meshed arrows represent the current when the delay circuits 14 operate according to the change in the address signals AD. Since the address latches 16 do not operate in synchronization with the clock signal CLK, the current consumption during the standby state is low.

Figure 5:
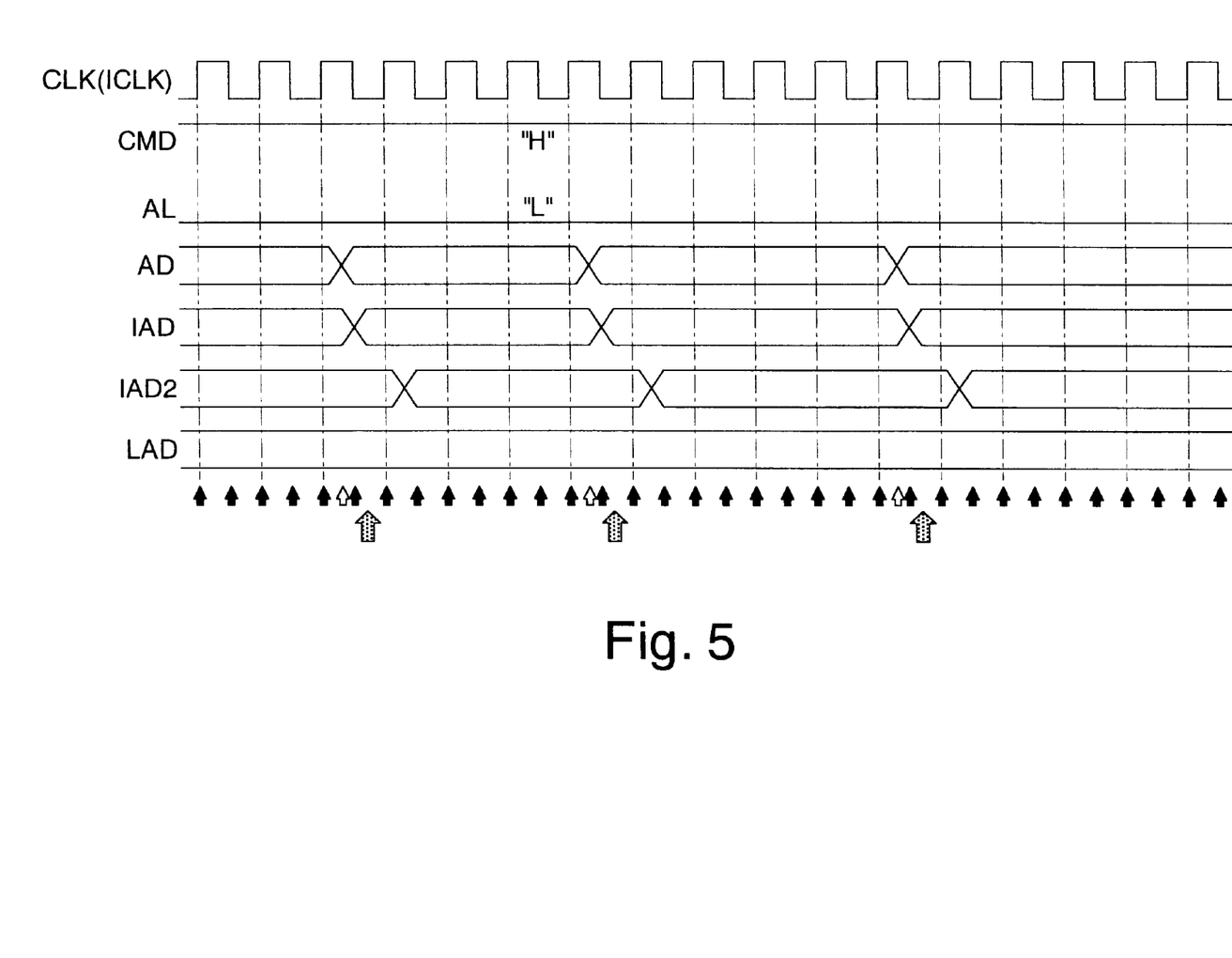
FIG. 5 is a timing chart showing the receiving operation of the address signal in a standby state (when the frequency of the clock signal is high)

FIG. 5 shows the receiving operation of the address signal AD in a standby state in the above-described SDRAM (when the frequency of the clock signal CLK is high). During the standby state, the SDRAM keeps on receiving the clock signal CLK, but does not perform its internal operation. Since a clock cycle increases, frequency of changes in the address signal AD (frequency of the controller such as CPU accessing other devices on the system) increases as compared with that in FIG. 4.

Similarly to FIG. 4, black arrows represent the current when the input buffer 10a and the command latch/decoder 12 operate according to the change in the clock signal CLK. White arrows represent the current when the input buffers 10c operate according to the change in the address signals AD. Meshed arrows represent the current when the delay circuits 14 operate according to the change in the address signals AD. Since the clock cycle increases, the operation frequencies of the command latch/decoder 12 and the input buffer 10a increase. However, the currents consumed in the command latch/decoder 12 and the input buffer 10a are originally low and the operation frequencies of the input buffers 10c are low, and therefore, the current consumption during the standby state does not increase substantially even though the frequency of the clock signal CLK is high.

Figure 6:
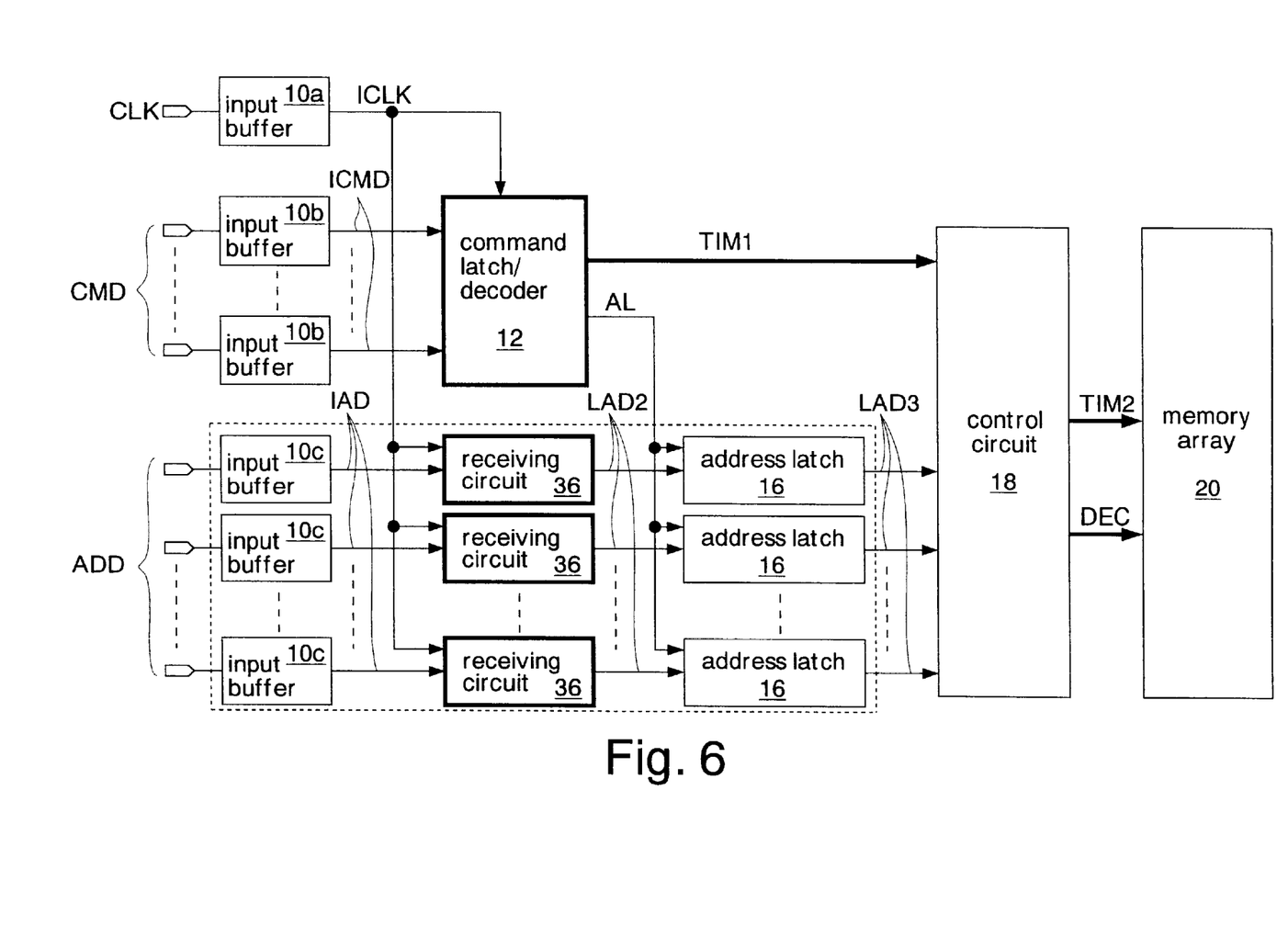
FIG. 6 is a block diagram showing SDRAM which the present inventor studied before the present invention.

FIG. 6 shows SDRAM which the present inventor investigated before the present invention. In this SDRAM, receiving circuits 36 are arranged instead of the delay circuits 14 shown in FIG. 1. The rest of the circuit structure is the same as that of FIG. 1. The command latch/decoder 12 and the receiving circuits 36 indicated by bold frames, are the circuits which operate in synchronization with the clock signal CLK.

The receiving circuits 36 are composed of, for example, the same circuits as those of the address latches 16 shown in FIG. 2, and receive the internal address signals IAD in synchronization with the rising edge of the internal clock signal ICLK. Namely, in this SDRAM, the internal clock signal ICLK is supplied not only to the command latch/decoder 12 but also to the receiving circuits 36. The receiving circuits 36 output the received signals as latched address signals LAD2. The address latches 16 latch the latched address signals LAD2 in synchronization with the rising edges of the address signals AL, and output the latched signals as latched address signals LAD3.

Figure 7:
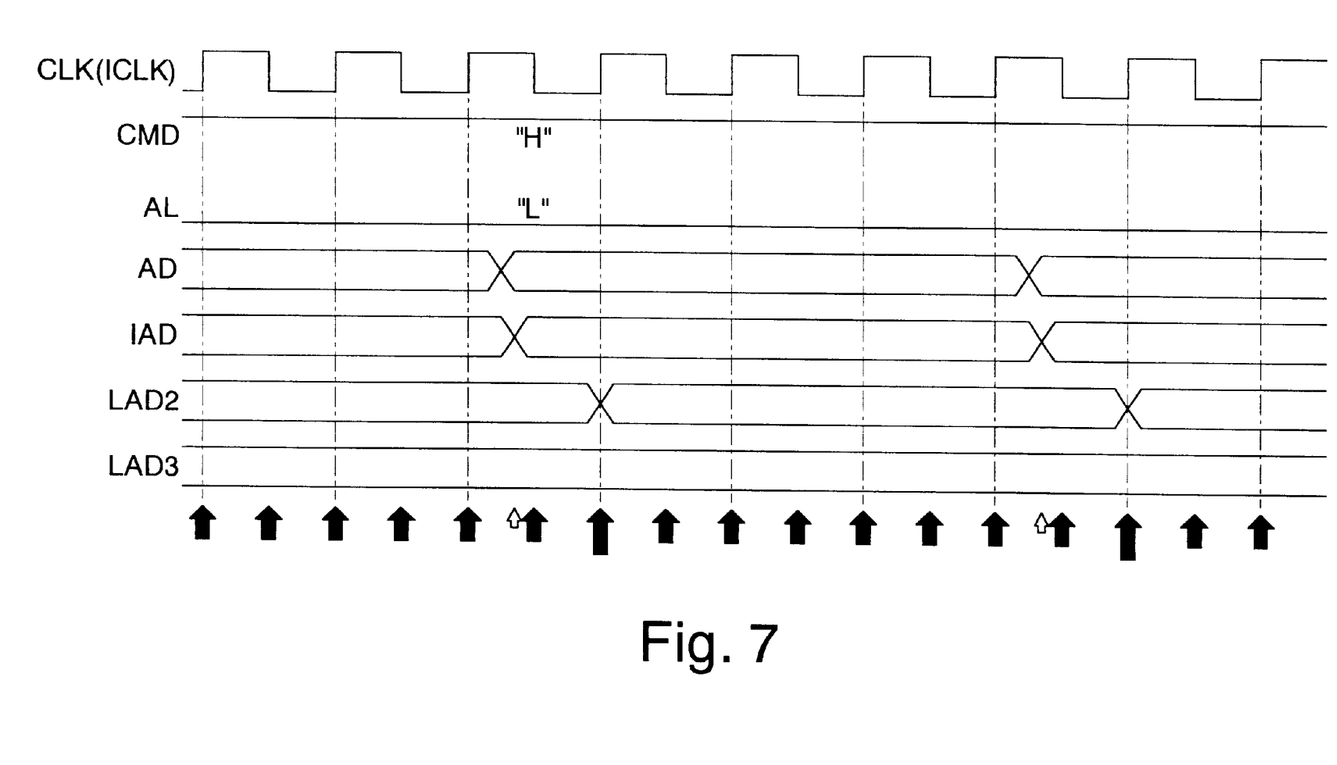
FIG. 7 is a timing chart showing the receiving operation of the address signal in a standby state in the SDRAM of FIG. 6 (when the frequency of the clock signal is low)

FIG. 7 shows the receiving operation of the address signal AD in a standby state in the SDRAM of FIG. 6 (when the frequency of the clock signal CLK is low). In this example, the receiving circuits 36 as well as the command latch/decoder 12 operate in synchronization with the rising edge and falling edge of the internal clock signal ICLK. Therefore, black arrows (current consumption) are larger than those in FIG. 4.

When the address signals AD change, the receiving circuits 36 receive the changed address signals IAD in synchronization with the rising edge of the internal clock signal ICLK. Hence, the black arrows (current consumption) at the time when the latched address signals LAD2 change are larger than the other black arrows. Thus, receiving operation of the address signals AD is performed by the clock signal CLK even during the standby state, and hence standby current increases as compared with that in FIG. 4.

Figure 8:
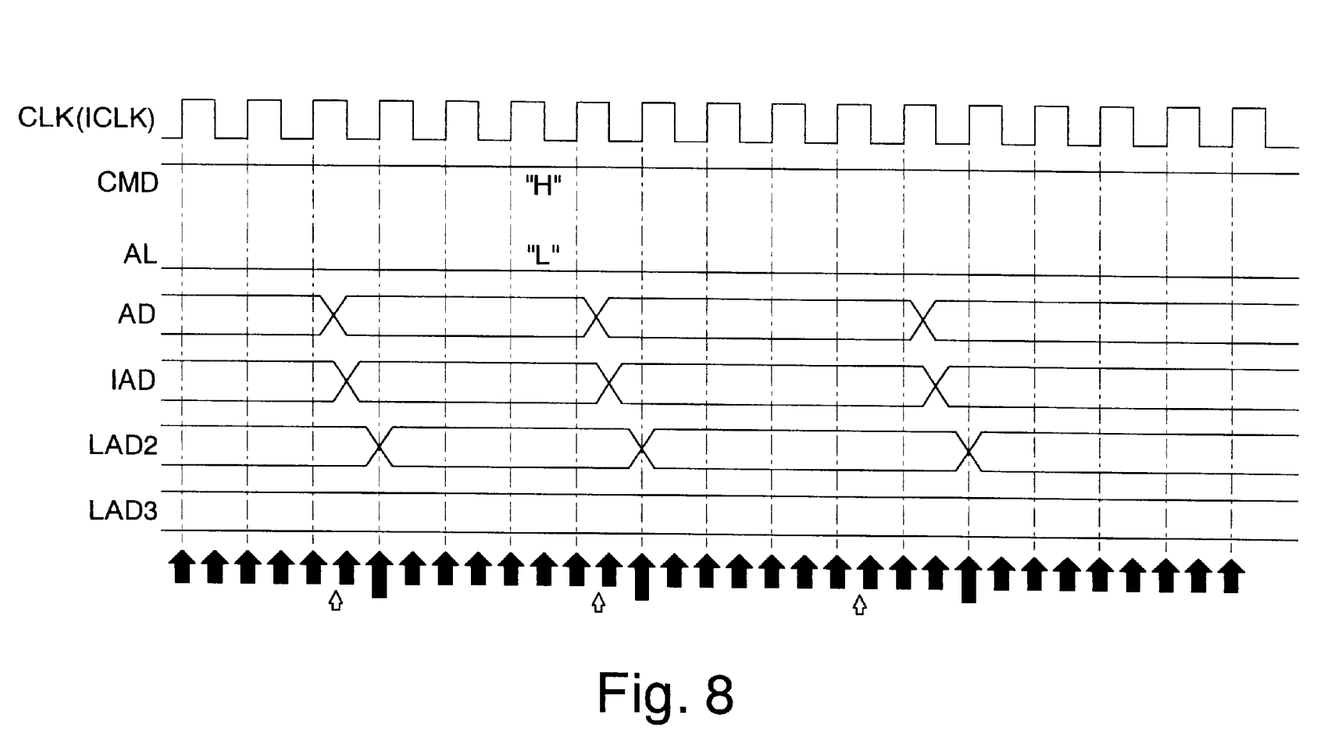
FIG. 8 is a timing chart showing the receiving operation of the address signal in a standby state in the SDRAM of FIG. 6 (when the frequency of the clock signal is high)

FIG. 8 shows receiving operation of the address signal AD in a standby state in the SDRAM of FIG. 6 (when the frequency of the clock signal CLK is high). A clock cycle increases in this example so that the operation frequencies of the command latch/decoder 12 and the receiving circuits 36 and the frequency of changes in the address signal AD increase. A large amount of the current is consumed in the command latch/decoder 12 and the receiving circuits 36 so that the frequency of the clock signal CLK increases, by which substantially increases current consumption.

As described above, each address latch 16 receives the address signal AD (IAD2) in synchronization with the address latch signal AL which is generated by the combination of the command signals CMD. Namely, the address latch 16 is operated asynchronously to the clock signal CLK to receive only the address signal AD which is necessary for the operation of the SDRAM. Therefore, the operation frequency of the address latch 16 decreases, thereby reducing the current consumption.

The address signals AD are transmitted to the address latches 16 asynchronously to the clock signal CLK, whereby the number of the circuits to be operated in synchronization with the clock signal CLK are reduced. Thus, the standby current can be reduced. Since the standby current is originally low, the increase in the standby current can be gradual even when the frequency of the clock signal CLK increases.

The plurality of the address latches 16 are formed corresponding to the plurality of the address signals AD for identifying the plurality of the memory cells in the memory array 20. It is possible to reduce the current consumption of each address latch 16 during the standby state, and therefore, the standby current can be reduced substantially.

The delay time of the delay circuits 14 is set corresponding to the time from the reception of the command signals CMD by the command latch/decoder 12 to the output of the address latch signals AL. The address signals AD supplied with the command signals CMD in synchronization with the clock signal CLK can be securely received in the address latch 16 by transmitting the address signals AD to the address latches 16 through the delay circuits 14 having the above delay time.

Incidentally, in the above-described embodiment, the example of applying the present invention to the SDRAM is explained. The present invention is not limited to the above embodiment. For example, the present invention may be applied to an address receiving circuit of a logic LSI such as a CPU and the like.

In the above-described embodiment, the example of applying the present invention to the receiving circuit of the address signal is explained. The present invention is not limited to the above embodiment. For example, as shown in FIG. 9 the present invention may be applied to a receiving circuit of a data signal composed of a plurality of bits.

Figure 9:
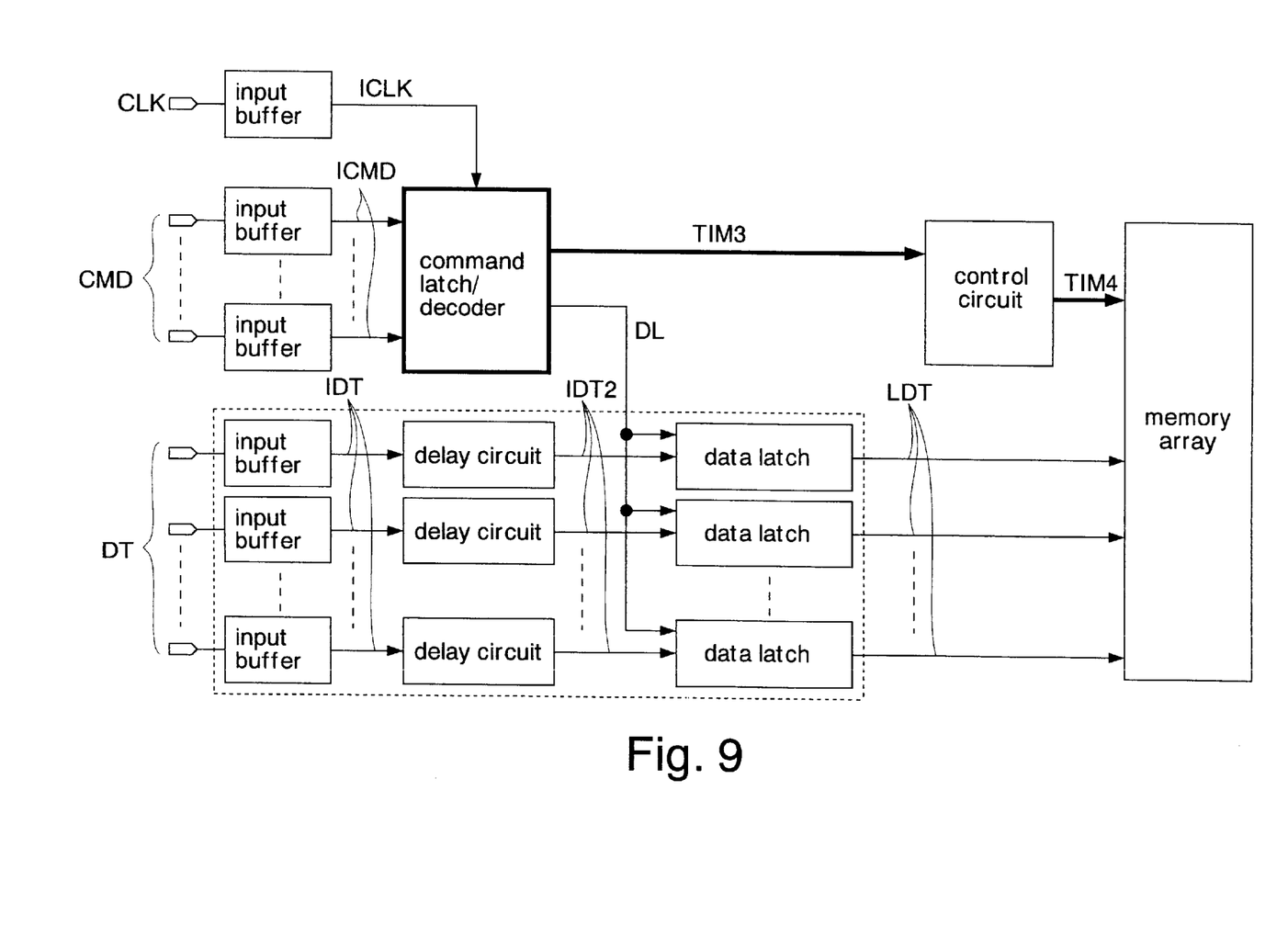
FIG. 9 is a block diagram showing an example where the present invention is applied to the receiving circuit of a data signal.

In FIG. 9, the command latch/decoder (timing signal generator) receives a plurality of command signals CMD (ICMD) in synchronization with a clock signal CLK (ICLK) and generates a timing signal (TIM3, a data latch signal DL) according to a combination of the command signals CMD. The delay circuit delays a data signal received asynchronously to the clock signal by a predetermined time. The data latch (receiving circuit) receives the data signal IDT2 delayed by the delay circuit, in synchronization not with the clock signal CLK but with the data latch signal DL. Namely, the receiving circuit operates asynchronously to the clock signal, and receives only necessary data signals for the internal operation of the semiconductor integrated circuit.

The invention is not limited to the above embodiments and various modifications may be made without departing from the spirit and the scope of the invention. Any improvement may be made in part or all of the components.

What is claimed is:

1. A semiconductor integrated circuit comprising:
    a timing signal generator for receiving a plurality of control signals in synchronization with a clock signal and generating a timing signal according to a combination of the control signals;
    a delay circuit for delaying an input signal received asynchronously to said clock signal; and
    a receiving circuit for receiving said input signal delayed by said delay circuit, in synchronization with said timing signal, wherein
        a delay time of said delay circuit is set approximately equal to a period of time from reception of said control signals to output of said timing signal by said timing signal generator.

2. The semiconductor integrated circuit according to claim 1, further comprising:
    an input buffer for receiving said input signal asynchronously to said clock signal and outputting the received signal to said delay circuit.

3. The semiconductor integrated circuit according to claim 1, wherein said input signal is an address signal.

4. The semiconductor integrated circuit according to claim 1, further comprising:

a memory array including a plurality of memory cells, and wherein       said input signal is a data signal written to said memory cells.

5. The semiconductor integrated circuit according to claim 1, further comprising:

a memory array including a plurality of memory cells, and wherein:

said control signals are command signals for instructing operation of said memory array; and       said input signal is an address signal for identifying said memory cells.

\* \* \* \* \*